United States Patent
Xu

(10) Patent No.: US 10,884,054 B2
(45) Date of Patent: *Jan. 5, 2021

(54) DETECTING DETERIORATION OF AN ELECTRICAL CIRCUIT IN AN AGGRESSIVE ENVIRONMENT

(71) Applicant: NOKIA OF AMERICA CORPORATION, Murray Hill, NJ (US)

(72) Inventor: Chen Xu, New Providence, NJ (US)

(73) Assignee: NOKIA OF AMERICA CORPORATION, Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/101,916

(22) Filed: Aug. 13, 2018

(65) Prior Publication Data

US 2019/0004109 A1    Jan. 3, 2019

Related U.S. Application Data

(63) Continuation of application No. 15/251,133, filed on Aug. 30, 2016, now Pat. No. 10,067,179.

(51) Int. Cl.
*G01R 31/28* (2006.01)

(52) U.S. Cl.
CPC ..... *G01R 31/2856* (2013.01); *G01R 31/2812* (2013.01); *G01R 31/2836* (2013.01)

(58) Field of Classification Search
CPC ............ G01R 31/2856; G01R 31/2812; G01R 31/2836
See application file for complete search history.

(56) References Cited

U.S. PATENT DOCUMENTS

| 4,870,855 A * | 10/1989 | Shafer ...................... G01N 1/22 73/31.05 |
|---|---|---|
| 5,307,018 A | 4/1994 | Gadgil |
| 5,481,198 A | 1/1996 | Patel |
| 7,652,585 B2 | 1/2010 | Schierling |
| 9,164,140 B2 | 10/2015 | Moell et al. |
| 2003/0154053 A1* | 8/2003 | Saga .................... F02D 41/1494 702/185 |
| 2005/0269213 A1 | 12/2005 | Steimle et al. |
| 2006/0162431 A1 | 7/2006 | Harris et al. |
| 2008/0107151 A1 | 5/2008 | Khadkikar et al. |

(Continued)

*Primary Examiner* — Alvaro E Fortich

(74) *Attorney, Agent, or Firm* — Mendeslohn Dunleavy, P.C.; Yuri Gruzdkov

(57) ABSTRACT

We disclose a circuit board that hosts at least first and second types of resistance sensors and a method of operating the same. The resistance of each sensor of the first type tends to increase, and the resistance of each sensor of the second type tends to decrease if the sensor is exposed to an aggressive environment. The circuit board also hosts a control circuit that operates to monitor respective resistances of the various resistance sensors and to process the digital values representing the resistances to estimate the working condition of one or more other electrical circuits located on the circuit board and/or in relatively close proximity to the circuit board in the corresponding equipment cabinet. The control circuit further operates to transmit out an appropriate alarm message if the estimated working condition is deemed unsatisfactory.

28 Claims, 4 Drawing Sheets

(56) References Cited

U.S. PATENT DOCUMENTS

| | | | |
|---|---|---|---|
| 2008/0202553 A1 | 8/2008 | Hicks et al. | |
| 2008/0255771 A1* | 10/2008 | Beard | G01N 29/041 |
| | | | 702/34 |
| 2009/0043441 A1* | 2/2009 | Breed | G07C 5/008 |
| | | | 701/31.9 |
| 2009/0268324 A1* | 10/2009 | Iben | G11B 5/00826 |
| | | | 360/31 |
| 2011/0234215 A1 | 9/2011 | Ausserlechner | |
| 2012/0053901 A1* | 3/2012 | Arefeen | G05B 23/0213 |
| | | | 702/183 |
| 2012/0119759 A1* | 5/2012 | Nelson | F02D 41/1466 |
| | | | 324/691 |
| 2013/0041622 A1 | 2/2013 | Lu et al. | |
| 2013/0256296 A1* | 10/2013 | Hocken | G01N 15/0656 |
| | | | 219/497 |
| 2014/0208847 A1 | 7/2014 | Baranov et al. | |
| 2016/0377501 A1* | 12/2016 | Agarwal | G01L 25/00 |
| | | | 73/1.15 |

* cited by examiner

DETECTING DETERIORATION OF AN ELECTRICAL CIRCUIT IN AN AGGRESSIVE ENVIRONMENT

CROSS-REFERENCE TO RELATED APPLICATIONS

This application is a continuation of U.S. patent application Ser. No. 15/251,133, filed on Aug. 30, 2016, and entitled "DETECTING DETERIORATION OF AN ELECTRICAL CIRCUIT IN AN AGGRESSIVE ENVIRONMENT," which is incorporated herein by reference in its entirety.

BACKGROUND

Field

The present disclosure relates to electrical circuits and, more specifically but not exclusively, to methods and apparatus for detecting deterioration of an electrical circuit in an aggressive environment.

Description of the Related Art

This section introduces aspects that may help facilitate a better understanding of the disclosure. Accordingly, the statements of this section are to be read in this light and are not to be understood as admissions about what is in the prior art or what is not in the prior art.

Environmental conditions can have a drastic effect on the reliability and performance of electrical circuits, such as those used in the telecom equipment deployed in geographic regions characterized by aggressive environments. For example, the adverse effects of exposure to extreme temperatures, high humidity, atmospheric dust, and corrosive agents can cause some electrical circuits to fail. It is therefore desirable to have a system in place that can warn the equipment operator about the impending failure of such circuits.

SUMMARY OF SOME SPECIFIC EMBODIMENTS

Disclosed herein are various embodiments of a circuit board that hosts at least first and second types of resistance sensors and a method of using the resistance sensors for detecting deterioration of the corresponding electrical circuit(s) in an aggressive environment. The resistance of each sensor of the first type tends to increase, and the resistance of each sensor of the second type tends to decrease if the sensor is exposed to an aggressive environment. The circuit board also hosts a control circuit that operates to monitor respective resistances of the various resistance sensors and to process the digital values representing the resistances to estimate the working condition of one or more other electrical circuits located on the circuit board and/or in relatively close proximity to the circuit board in the corresponding equipment cabinet. The control circuit further operates to transmit out an appropriate alarm message if the estimated working condition is deemed unsatisfactory.

Some disclosed embodiments can advantageously be used, e.g., by telecom equipment operators to minimize or avoid network outages by taking appropriate remedial actions in response to the received alarm message(s).

According to an example embodiment, provided is an apparatus comprising: a substrate; a first plurality of sensors supported on the substrate, each sensor of the first plurality characterized by a respective resistance that tends to increase in response to the sensor being exposed to an aggressive environment; a second plurality of sensors supported on the substrate, each sensor of the second plurality characterized by a respective resistance that tends to decrease in response to the sensor being exposed to the aggressive environment; and a control circuit supported on the substrate, electrically connected to each of the first plurality of sensors and each of the second plurality of sensors, and configured to determine the respective resistances of the first plurality of sensors and the second plurality of sensors.

According to another example embodiment, provided is an apparatus comprising: a substrate; a first resistive sensor having an electrically conductive trace that comprises a first metal or metallic alloy, the electrically conductive trace being disposed on the substrate to electrically connect a first terminal and a second terminal and having an electrical resistance that changes in response to exposure to an aggressive environment; a second resistive sensor having an electrically conductive trace that comprises a second metal or metallic alloy, the second metal or metallic alloy being different from the first metal or metallic alloy, the electrically conductive trace of the second sensor being disposed on the substrate to electrically connect a third terminal and a fourth terminal and having an electrical resistance that changes in response to exposure to the aggressive environment; a third resistive sensor having a first resistive element in electrical contact with a fifth terminal and a second resistive element in electrical contact with a sixth terminal, the first and second resistive elements being arranged on the substrate such that insulation resistance between the first and second resistive elements changes in response to exposure to the aggressive environment; and a control circuit supported on the substrate and being configured to measure electrical resistances between the first and second terminals, the third and fourth terminals, and the fifth and sixth terminals, respectively.

According to yet another example embodiment, provided is a method of estimating a working condition of an electrical circuit, the method comprising: operating an electrical circuit that comprises: a first plurality of sensors supported on a substrate, each sensor of the first plurality characterized by a respective resistance that increases in response to the sensor being damaged by environmental exposure; and a second plurality of sensors supported on the substrate, each sensor of the second plurality characterized by a respective resistance that decreases in response to the sensor being damaged by the environmental exposure; and wherein the electrical circuit comprises a control circuit supported on the substrate, electrically connected to each of the first plurality of sensors and each of the second plurality of sensors, and configured to determine the respective resistances of the first plurality of sensors and the second plurality of sensors.

According to yet another example embodiment, provided is a method of estimating a working condition of an electrical circuit, the method comprising the steps of: measuring electrical properties of a plurality of electrical circuits constructed such that each of the electrical properties is responsive to damage of a corresponding one of the electrical circuits by an environmental exposure thereof; and generating an alarm via a control circuit responsive to the measured electrical properties indicating damage of one or more of the electrical circuits.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
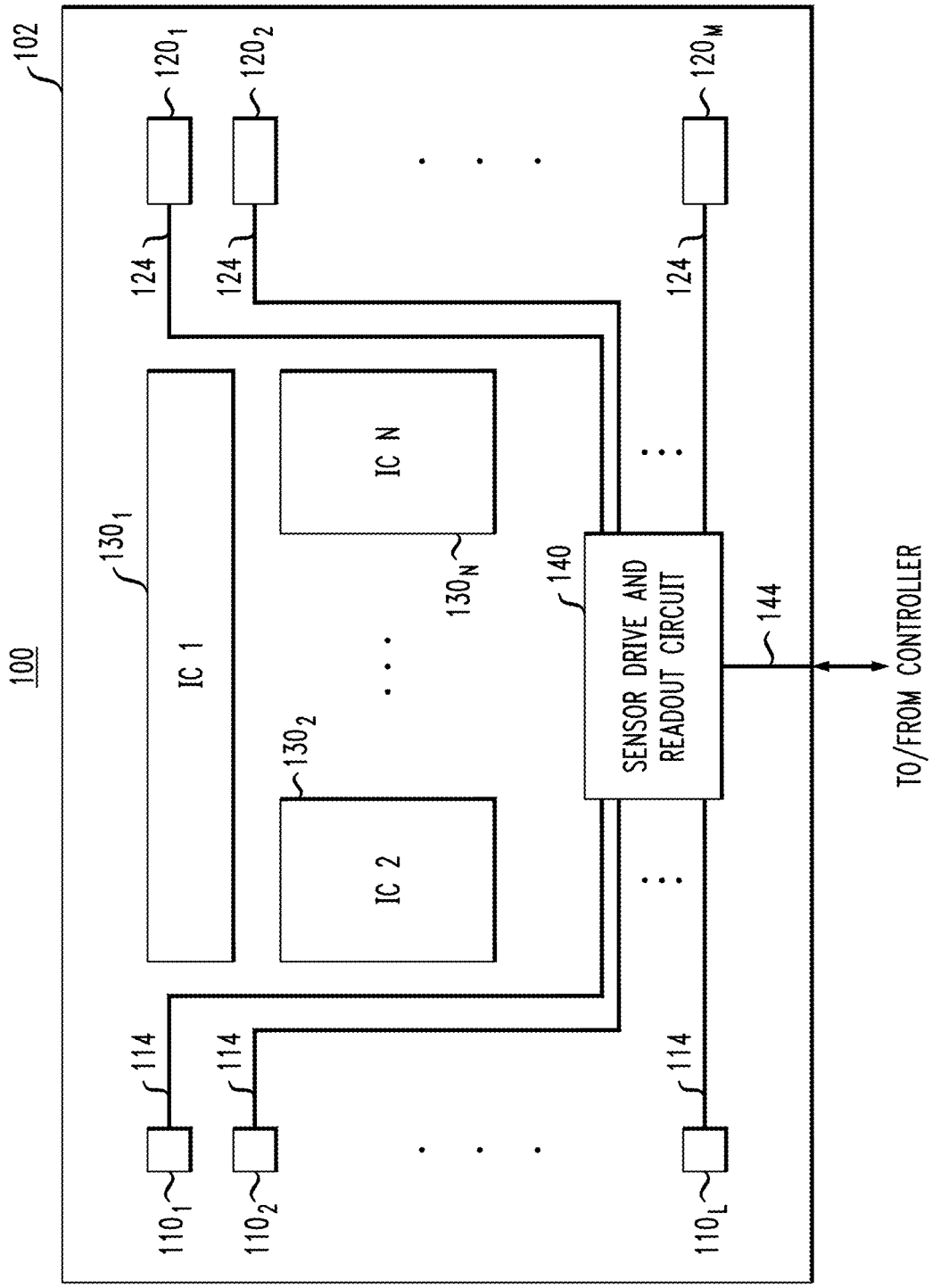
FIG. 1 shows a block diagram of an electrical circuit according to an embodiment.

FIG. 1 shows a block diagram of an electrical circuit 100 according to an embodiment. Circuit 100 includes a printed circuit board (PCB) 102 that mechanically supports and electrically connects various electronic components of the circuit using conductive tracks, pads, and other features etched from the sheet(s) of an electrically conductive material laminated onto a non-conductive (e.g., dielectric) substrate. For illustration purposes and without any implied limitation, only some of the conductive tracks, e.g., labeled 114 and 124, of PCB 102 are shown in FIG. 1. In various embodiments, PCB 102 can be single sided (e.g., having conductive tracks arranged in a single surface layer), double sided (e.g., having conductive tracks arranged in two surface layers), or multi-layered (e.g., having a multi-layer stack of conductive tracks electrically interconnected using conductive vias).

In an example embodiment, the electronic components of circuit 100 may include an assortment of one or more integrated-circuit (IC) packages and/or one or more discrete circuit elements (such as capacitors, resistors, inductors, and/or active devices) that are typically soldered onto PCB 102. In some embodiments, some of the electronic components of circuit 100 may be embedded into the substrate of PCB 102. For illustration purposes and without any implied limitation, circuit 100 is depicted in FIG. 1 as having the following circuit components: (i) a plurality of sensors $110_1$-$110_L$, (ii) a plurality of sensors $120_1$-$120_M$, (iii) one or more IC packages $130_1$-$130_N$, and (iv) a sensor drive-and-readout circuit 140, where each of L and M is an integer greater than one, and N is a positive integer. Embodiments in which L=2, or M=2, or L=M=2 are also possible. In some embodiments, IC packages $130_1$-$130_N$ are optional and may be absent. Embodiments in which N=1 or 2 are also possible.

Sensors $110_1$-$110_L$ are electrically connected to the sensor drive-and-readout circuit 140 by way of conductive tracks 114. Sensors $120_1$-$120_M$ are similarly electrically connected to the sensor drive-and-readout circuit 140 by way of conductive tracks 124. Circuit 140 can be electrically connected to an external electronic controller by way of conductive tracks 144. In operation, circuit 140 can perform one or more of the following functions: (i) respond to control signals received by way of conductive tracks 144 from an external electronic controller to perform resistance measurements of individual sensors $110_1$-$110_L$ and $120_1$-$120_M$; (ii) generate and apply various voltages and/or currents to individual sensors $110_1$-$110_L$ and $120_1$-$120_M$; (iii) sense and measure various voltages and/or currents at sensors $110_1$-$110_L$ and $120_1$-$120_M$; (iv) perform signal processing to determine resistance values corresponding to individual sensors $110_1$-$110_L$ and $120_1$-$120_M$; and (v) generate control signals for the external electronic controller that indicate the estimated condition of IC packages $130_1$-$130_N$ and/or other electronic circuits and devices located in relatively close proximity to circuit 100. In various embodiments, circuit 140 can be implemented as an application-specific integrated circuit (ASIC) or a microcontroller.

In an example embodiment, circuit 100 is designed and configured to be housed in an equipment cabinet (not explicitly shown in FIG. 1) that contains telecommunication equipment. In some embodiments, IC packages $130_1$-$130_N$ may comprise electronic and/or optical circuits and devices that are part of the telecommunication equipment. Sensors $110_1$-$110_L$ and $120_1$-$120_M$ and the sensor drive-and-readout circuit 140 can be used to estimate the adverse effects of exposure to an aggressive environment on the telecommunication equipment housed in the same equipment cabinet as circuit 100, e.g., as further described below in reference to FIGS. 2-4. In embodiments in which IC packages $130_1$-$130_N$ are absent, circuit 100 is a dedicated circuit that can be used primarily or exclusively for such estimation purposes. The information obtained using sensors $110_1$-$110_L$ and $120_1$-$120_M$ can beneficially be used, e.g., to forecast the demand for spare parts, minimize or avoid the costly network outage caused by impending equipment failure, and/or flag an offending site in order to limit further equipment deployment therein, implement a site improvement, or initiate equipment relocation therefrom.

Figure 2:
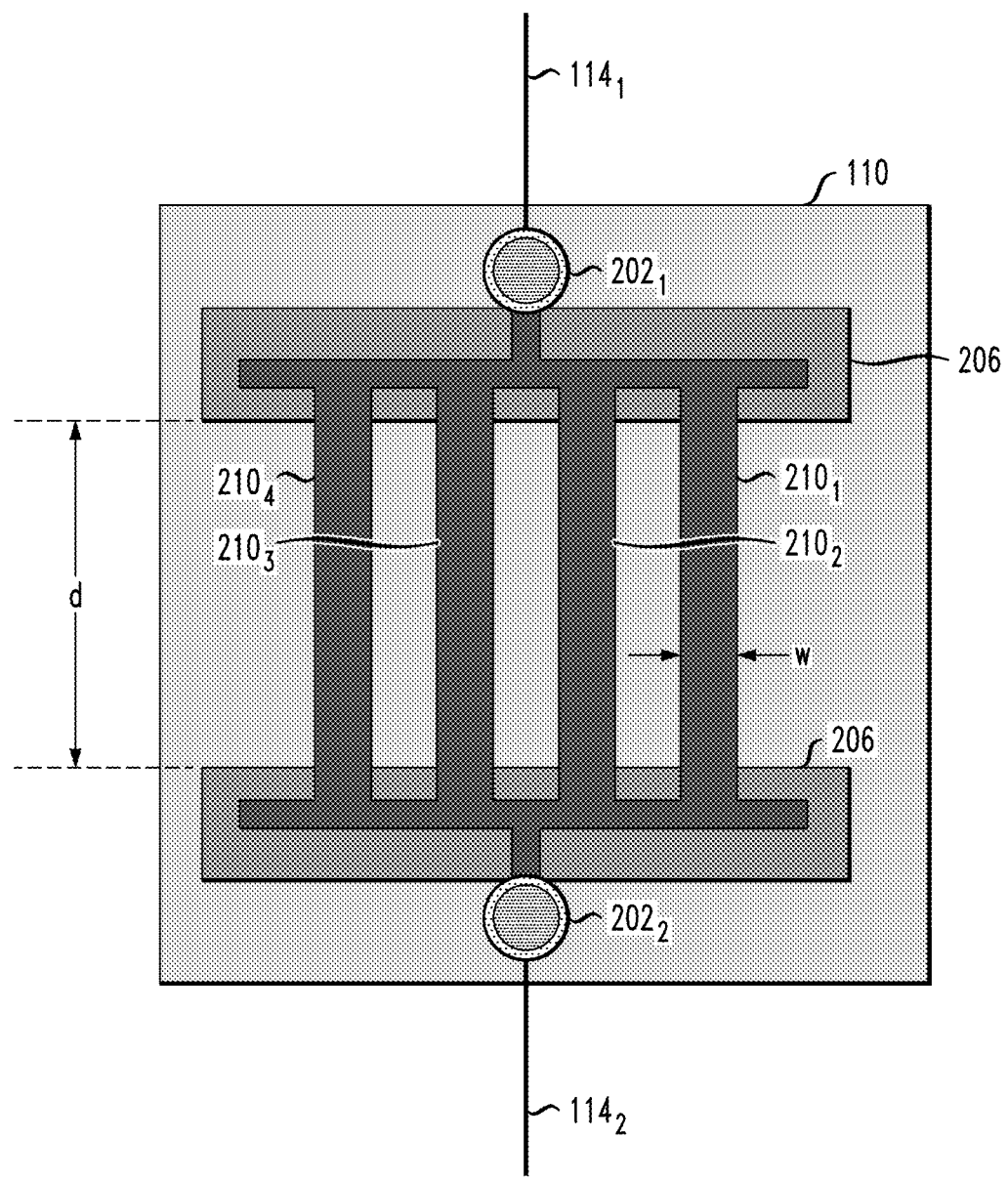
FIG. 2 shows a schematic view of a first sensor that can be used in the electrical circuit of FIG. 1 according to an embodiment.

FIG. 2 shows a schematic view of an individual sensor 110 that can be used in circuit 100 (FIG. 1) according to an embodiment. Sensor 110 can be electrically connected to the sensor drive-and-readout circuit 140 using conductive tracks $114_1$ and $114_2$ connected to contact pads $202_1$ and $202_2$, respectively, of the sensor as indicated in FIG. 2. As already indicated above, conductive tracks $114_1$ and $114_2$ can be used to perform one or more of the following: (i) apply a desired voltage to sensor 110; (ii) sense a voltage across sensor 110; (iii) drive a desired current through sensor 110; and (iv) sense a current flowing through sensor 110.

In an example embodiment, sensor 110 comprises a plurality of electrically conductive traces 210 that are connected in parallel to one another between contact pads $202_1$ and $202_2$, e.g., as indicated in FIG. 2. For illustration purposes and without any implied limitation, sensor 110 is depicted in FIG. 2 as having four such electrically conductive traces, which are labeled $210_1$-$210_4$. In an alternative embodiment, sensor 110 may have a different (from four) number of conductive traces 210.

Each of conductive traces $210_1$-$210_4$ comprises a substantially flat metal stripe that has a constant width w and a constant thickness t. For illustration, the width w is indicated in FIG. 2 for conductive trace $210_1$. The thickness t represents the dimension of conductive trace 210 in the direction that is orthogonal to the plane of FIG. 2. The ends of conductive traces $210_1$-$210_4$ are encapsulated using stripes 206 of a suitable protective (e.g., polymeric or ceramic) material. This protective material serves to ensure good electrical contact between conductive traces $210_1$-$210_4$ and contact pads $202_1$ and $202_2$ in field conditions where the exposed middle portions of the conductive traces might be subjected to an aggressive environment. The length of the exposed middle portions of conductive traces $210_1$-$210_4$ is labeled in FIG. 2 as d.

In an example embodiment, the width w, the length d, and the thickness t of conductive traces $210_1$-$210_4$ are selected such that the initial resistance of sensor 110 is in the range between approximately 0.1Ω and approximately 10Ω. Exposure to an aggressive environment typically causes the resistance of sensor 110 to increase over time, e.g., due to corrosion of conductive traces $210_1$-$210_4$. A person of ordinary skill in the art will understand that, for the indicated resistance range, good electrical contacts between conductive traces $210_1$-$210_4$ and contact pads $202_1$ and $202_2$ protected by the encapsulating stripes 206 help to achieve sufficient accuracy/precision of the corresponding resistance measurements.

Different instances of sensor 110 used in circuit 100 (FIG. 1) may differ from one another in one or more of the following characteristics: (i) the material of conductive traces 210; (ii) the width w of conductive traces 210; (iii) the thickness t of conductive traces 210; and (iv) the length d of exposed portions of conductive traces 210. Example materials that can be used to make conductive traces 210 include but are not limited to copper, silver, aluminum, tin, lead, nickel, zinc, iron, and various alloys and/or multi-layered metal structures thereof. The materials for conductive traces 210 are typically selected from the material set used in PCB 102, IC packages $130_1$-$130_N$, and other electronic circuits and devices expected to be located in the same equipment cabinet as circuit 100. In an example embodiment, sensors $110_1$-$110_L$ may include at least one sensor 110 whose conductive traces 210 are made of copper and at least one sensor 110 whose conductive traces 210 are made of silver.

Figure 3:
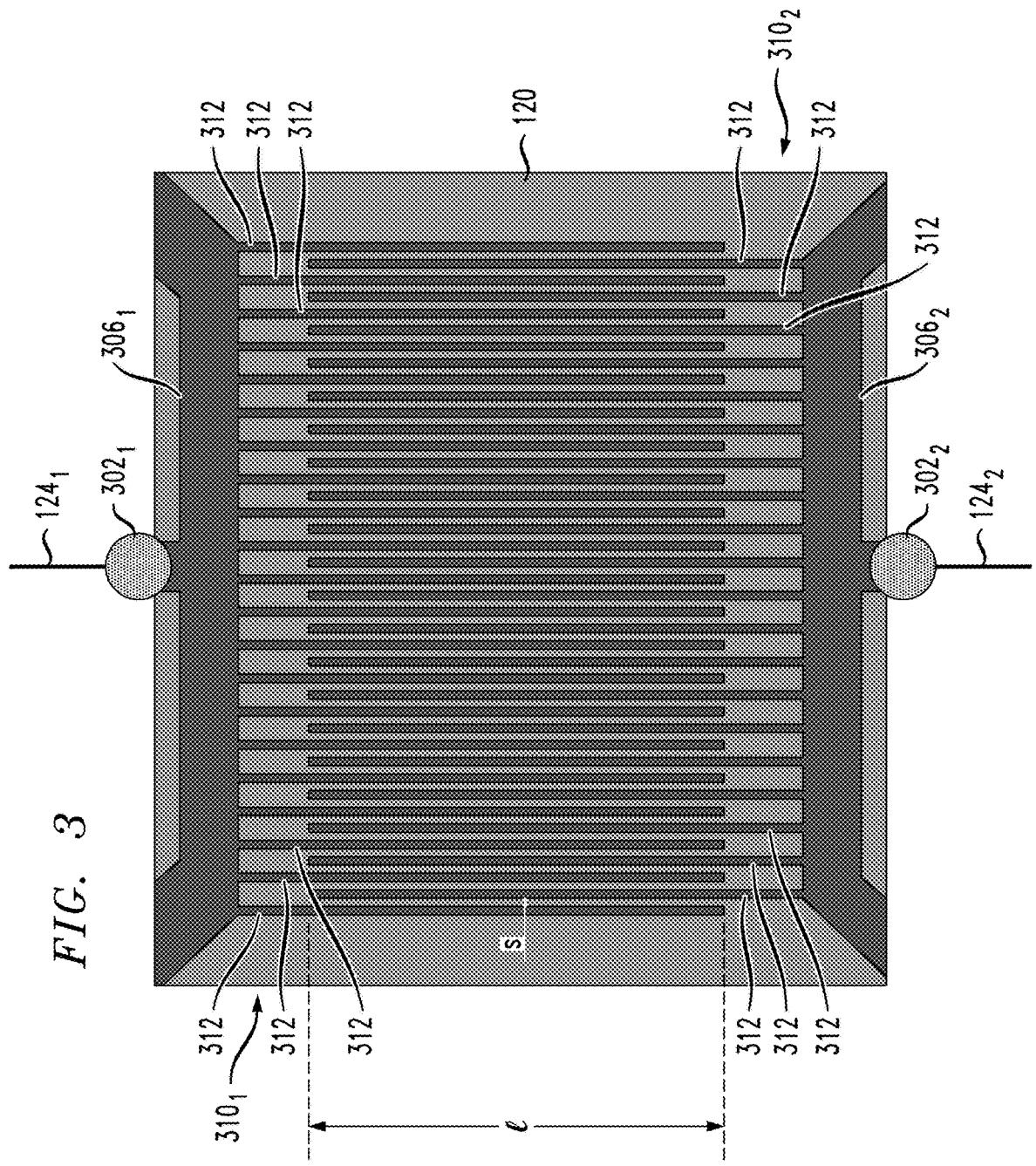
FIG. 3 shows a schematic view of a second sensor that can be used in the electrical circuit of FIG. 1 according to an embodiment.

FIG. 3 shows a schematic view of an individual sensor 120 that can be used in circuit 100 (FIG. 1) according to an embodiment. Sensor 120 can be electrically connected to the sensor drive-and-readout circuit 140 using conductive tracks $124_1$ and $124_2$ connected to contact pads $302_1$ and $302_2$, respectively, of the sensor as indicated in FIG. 3. Conductive tracks $124_1$ and $124_2$ can be used to perform one or more of the following: (i) apply a desired voltage to sensor 120; (ii) sense a voltage across sensor 120; (iii) drive a desired current through sensor 120; and (iv) sense a current flowing through sensor 120.

In an example embodiment, sensor 120 comprises interleaved combs $310_1$ and $310_2$. A base $306_1$ of comb $310_1$ is electrically connected to contact pad $302_1$ as indicated in FIG. 3. A base $306_2$ of comb $310_2$ is similarly electrically connected to contact pad $302_2$. For illustration purposes and without any implied limitation, comb $310_1$ is depicted in FIG. 3 as having 21 teeth 312, and comb $310_2$ is depicted as having 20 teeth 312. In an alternative embodiment, each of combs $310_1$ and $310_2$ may have a different respective number of teeth 312.

In an example embodiment, each of teeth 312 is an electrically conductive (e.g., metal) trace that comprises a substantially flat metal stripe that has a constant width and a constant thickness. The spacing s and the overlap length l between teeth 312 belonging to different ones of combs $310_1$ and $310_2$ are selected such that the initial surface insulation resistance (SIR) of sensor 120 is greater than 10 MΩ, but can decrease over time to fall into the range between approximately 10Ω and approximately 10 MΩ due to exposure to an aggressive environment. For illustration, the spacing s and the overlap length l are indicated in FIG. 3 for a pair of teeth 312 located at the left-hand side of combs $310_1$ and $310_2$. Exposure to an aggressive environment typically causes the SIR of sensor 120 to decrease, e.g., due to dust and/or salt accumulation, creep corrosion, and electrochemical migration.

Different instances of sensor 120 used in circuit 100 (FIG. 1) may differ from one another in one or more of the following: (i) the material of combs $310_1$ and $310_2$; (ii) the spacing s between adjacent teeth 312; (iii) the overlap length l of opposing teeth 312. Example materials that can be used to make combs $310_1$ and $310_2$ include but are not limited to copper, silver, aluminum, nickel, zinc, iron, and various alloys and/or multi-layered metal structures thereof. The materials for combs $310_1$ and $310_2$ are typically selected from the material set used in PCB 102, IC packages $130_1$-$130_N$, and other electronic circuits and devices expected to be located in the same equipment cabinet as circuit 100. In an example embodiment, sensors $120_1$-$120_M$ may include at least one sensor 120 whose combs $310_1$ and $310_2$ are made of copper plated with silver and at least one sensor 120 whose combs $310_1$ and $310_2$ are made of copper plated with tin.

Figure 4:
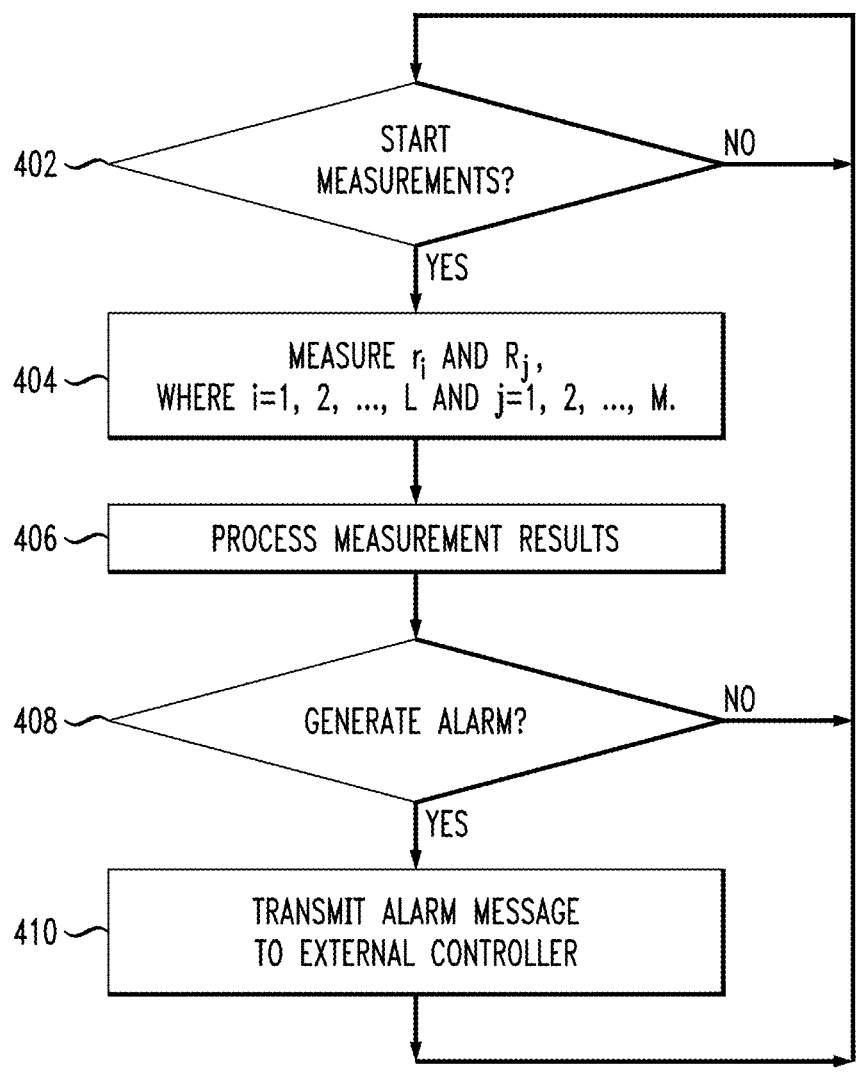
FIG. 4 shows a flowchart of a method of estimating the condition of an electrical circuit according to an embodiment.

FIG. 4 shows a flowchart of a method 400 of estimating the condition of an electrical circuit located in relatively close proximity to sensors $110_1$-$110_L$ and $120_1$-$120_M$ (FIG. 1) according to an embodiment. In some embodiments, the electrical circuit whose condition is being estimated using method 400 comprises one or more of IC packages $130_1$-$130_N$. In other embodiments, the electrical circuit whose condition is being estimated using method 400 comprises one or more electronic circuits and/or devices housed in the same equipment cabinet as circuit 100 (FIG. 1).

At step 402 of method 400, it is determined whether or not to start resistance measurements of sensors $110_1$-$110_L$ and $120_1$-$120_M$. In one example embodiment, an external electronic controller can initiate the resistance measurements by applying, e.g., by way of conductive tracks 144, an appropriate control signal to circuit 140. In another example embodiment, circuit 140 can run an internal timer and initiate the resistance measurements when the timer runs out. In yet another example embodiment, circuit 140 can initiate the resistance measurements in accordance with a predetermined schedule, e.g., stored in a non-volatile memory of the circuit. In some embodiments, circuit 140 can be configured to initiate resistance measurements of sensors $110_1$-$110_L$ and $120_1$-$120_M$ in response to any of a plurality of triggers that may include but are not limited to the above-indicated triggers based on an externally generated control signal, an internal timer, and a predetermined schedule.

If resistance measurements of sensors $110_1$-$110_L$ and $120_1$-$120_M$ are initiated at step 402, then the processing of method 400 is directed to step 404. Otherwise, circuit 140 remains in a waiting mode by cycling through step 402.

At step 404, circuit 140 measures, e.g., as known in the pertinent art, the respective resistances of each of sensors $110_1$-$110_L$ and $120_1$-$120_M$ or of any desired subset of these sensors. In an example embodiment, a resistance measurement carried out at step 404 may include the sub-steps of (i) applying a fixed voltage to a selected sensor and (ii) sensing and measuring the electrical current flowing through that sensor under the applied voltage. In an alternative embodiment, a resistance measurement carried out at step 404 may include the sub-steps of (i) driving a fixed current through a selected sensor and (ii) sensing and measuring the resulting voltage generated across that sensor. The resistance values of individual sensors can then be obtained by computing a ratio of the voltage to the current. The resistance values obtained at step 404 are typically time-stamped and stored in a nonvolatile memory of circuit 140, e.g., for retrieval at a later time and/or for further processing at step 406.

At step 406, circuit 140 processes the resistance values obtained at step 404 to estimate the condition of one or more electrical circuits located in relatively close proximity to sensors $110_1$-$110_L$ and $120_1$-$120_M$. In some embodiments, the data processing of step 406 may also use the resistance values stored in the nonvolatile memory of circuit 140 at one or more previous occurrences of step 404 corresponding to other (earlier) measurement times. In various embodiments, the data processing carried out at step 406 may include one or more data-processing operations selected from an example set of data-processing operations described in more detail below.

A first example data-processing operation that can be used at step 406 comprises comparing a measured resistance value with a threshold resistance value.

In an example embodiment, each of sensors $110_1$-$110_L$ and $120_1$-$120_M$ can be assigned a respective set of threshold resistance values. Such set of threshold resistance values may include, e.g., three different threshold resistance values, each indicative of a respective different degree of damage to the corresponding electrical circuit caused by exposure to an aggressive environment at the deployment site. The measured resistance value of the sensor can then be compared with each of these threshold resistance values to approximately gauge the condition of the circuit.

For example, sensor $110_i$ can be assigned three threshold resistance values $p_{i1} < p_{i2} < p_{i3}$, where the threshold resistance value $p_{i1}$ is greater than the initial resistance $r_{i0}$ of sensor $110_i$, and $i=1, 2, \ldots, L$. As used herein, the term "initial resistance" refers to the resistance of the sensor at the factory, prior to the field deployment of circuit 100. The threshold resistance values $p_{i1}$, $p_{i2}$, and $p_{i3}$ can be selected, e.g., as follows:

(i) the measured resistance $r_i$ of sensor $110_i$ smaller than $p_{i1}$ indicates that the corresponding electrical circuit is likely to be in a satisfactory working condition;

(ii) the measured resistance $r_i$ of sensor $110_i$ being in the interval between $p_{i1}$ and $p_{i2}$ indicates that the corresponding electrical circuit has likely sustained some minor damage;

(iii) the measured resistance $r_i$ of sensor $110_i$ being in the interval between $p_{i2}$ and $p_{i3}$ indicates that the corresponding electrical circuit has likely sustained moderate damage and may need to be replaced relatively soon; and (iv) the measured resistance $r_i$ of sensor $110_i$ greater than $p_{i3}$ indicates that the corresponding electrical circuit has likely sustained serious damage, might fail at any time, and needs to be replaced in an expeditious manner.

As another example, sensor $120_j$ can be assigned three threshold resistance values $\sigma_{j1} > \sigma_{j2} > \sigma_{j3}$, where the threshold resistance value $\sigma_{j1}$ is smaller than the initial surface insulation resistance $R_{j0}$ of sensor $120_j$, and $j=1, 2, \ldots, M$. The threshold resistance values $\sigma_{j1}$, $\sigma_{j2}$, and $\sigma_{j3}$ can be selected, e.g., as follows:

(i) the measured surface insulation resistance $R_j$ of sensor $120_j$ greater than $\sigma_{j1}$ indicates that the corresponding electrical circuit is likely to be in a satisfactory working condition;

(ii) the measured surface insulation resistance $R_j$ of sensor $120_j$ being in the interval between $\sigma_{j1}$ and $\sigma_{j2}$ indicates that the corresponding electrical circuit has likely sustained some minor damage;

(iii) the measured surface insulation resistance $R_j$ of sensor $120_j$ being in the interval between $\sigma_{j2}$ and $\sigma_{j3}$ indicates that the corresponding electrical circuit has likely sustained moderate damage and may need to be replaced relatively soon; and (iv) the measured surface insulation resistance $R_j$ of sensor $120_j$ greater than $\sigma_{j3}$ indicates that the corresponding electrical circuit has likely sustained serious damage, might fail at any time, and needs to be replaced in an expeditious manner.

Another example data-processing operation that can be used at step 406 comprises computing a rate of resistance change and comparing the computed rate with a threshold rate.

For example, for sensor $110_i$, the rate $v_i$ of resistance change can be computed in accordance with Eq. (1):

$$v_i = \{r_i(t_2) - r_i(t_1)\}/(t_2 - t_1) \tag{1}$$

where $r_i(t_2)$ is the resistance of sensor $110_i$ measured at time $t_2$; $r_i(t_1)$ is the resistance of sensor $110_i$ measured at time $t_1$; and $t_2 > t_1$. The rate $v_i$ computed in this manner can then be compared with a corresponding threshold rate $\lambda_i$. Similarly, for sensor $120_j$, the rate $V_j$ of surface insulation resistance change can be computed in accordance with Eq. (2):

$$V_j = \{R_j(t_1) - R_j(t_2)\}/(t_2 - t_1) \tag{2}$$

where $R_j(t_1)$ is the surface insulation resistance of sensor $120_j$ measured at time $t_1$; $R_j(t_2)$ is the surface insulation resistance of sensor $120_j$ measured at time $t_2$; and $t_2 > t_1$. The rate $V_j$ computed in this manner can then be compared with a corresponding threshold rate $\mu_j$. The threshold rates $\lambda_i$ and $\mu_j$ can be selected such that any rate $v_i$ greater than $\lambda_i$ and/or any rate $V_j$ greater than $\mu_j$ are indicative of an unacceptably harsh environment that might warrant relocation of the corresponding equipment from the current site or another appropriate remedial action by the equipment operator.

Yet another example data-processing operation that can be used at step 406 comprises computing an overall "health" indicator H for the corresponding equipment. In one possible embodiment, the health indicator H can be computed in accordance with Eq. (3):

$$H = \sum_{i=1}^{L} \frac{A_i}{r_i} + \sum_{j=1}^{M} B_j R_j \tag{3}$$

where $A_i$ is a fixed weighting coefficient corresponding to sensor $110_i$, and $B_j$ is a fixed weighting coefficient corresponding to sensor $120_j$. A person of ordinary skill in the art will understand that the value of the health indicator H computed in this manner tends to decrease as the exposure time of circuit 100 to an aggressive environment increases. Therefore, a health indicator value smaller than a certain designated threshold value $H_0$ (i.e., $H < H_0$) can be used to prompt the equipment operator to conduct or schedule an inspection of the corresponding equipment for possible maintenance and/or repairs to address the deteriorated "health" of the corresponding electrical circuits.

At step 408, circuit 140 uses the signal/data processing results of steps 404 and 406 to determine whether or not an appropriate alarm signal needs to be generated to alert the equipment operator about the deteriorating condition of the corresponding equipment. In various embodiments, various types of alarm signals can be generated depending on the types of data processing carried out at step 406. For example, one or more of the following fixed conditions can be used to cause a corresponding alarm message to be generated and transmitted out at step 410:

(i) the resistance $r_i$ of sensor $110_i$ measured at step 404 falls into the interval between $p_{i1}$ and $p_{i2}$;

(ii) the resistance $r_i$ of sensor $110_i$ measured at step 404 falls into the interval between $p_{i2}$ and $p_{i3}$;

(iii) the resistance $r_i$ of sensor $110_i$ measured at step 404 is greater than $p_{i3}$;

(iv) the surface insulation resistance $R_j$ of sensor $120_j$ measured at step 404 falls into the interval between $\sigma_{j1}$ and $\sigma_{j2}$;
(v) the surface insulation resistance $R_j$ of sensor $120_j$ measured at step 404 falls into the interval between $\sigma_{j2}$ and $\sigma_{j3}$;
(vi) the surface insulation resistance $R_j$ of sensor $120_j$ measured at step 404 is smaller than $\sigma_{j3}$;
(vii) the rate $v_i$ of resistance change for sensor $110_i$ computed at step 406 is greater than $\lambda_i$;
(viii) the rate $V_j$ of resistance change for sensor $120_j$ computed at step 406 is greater than $\mu_j$; and
(ix) the health indicator H computed at step 406 is smaller than $H_0$.

If it is determined at step 408 that any of the relevant conditions from this condition set is satisfied, then the processing of method 400 is directed to step 410. Otherwise, the processing of method 400 is directed back to step 402.

At step 410, circuit 140 generates an appropriate alarm message that indicates the condition(s) that caused the alarm message to be generated. Circuit 140 then transmits the generated alarm message, e.g., by way of conductive tracks 144, to the corresponding external electronic controller. After the transmission, the processing of method 400 is returned back to step 402. The external electronic controller may respond to the received alarm message by issuing a corresponding alert for the equipment operator.

According to an example embodiment disclosed above in reference to FIGS. 1-4, provided is an apparatus comprising: a substrate (e.g., part of 102, FIG. 1); a first resistive sensor (e.g., $110_1$, FIG. 1) having an electrically conductive trace (e.g., 210, FIG. 2) that comprises a first metal or metallic alloy, the electrically conductive trace being disposed on the substrate to electrically connect a first terminal (e.g., $202_1$, FIG. 2) and a second terminal (e.g., $202_2$, FIG. 2) and having an electrical resistance that changes in response to exposure to an aggressive environment; a second resistive sensor (e.g., $110_2$, FIG. 1) having an electrically conductive trace (e.g., 210, FIG. 2) that comprises a second metal or metallic alloy, the second metal or metallic alloy being different from the first metal or metallic alloy, the electrically conductive trace of the second sensor being disposed on the substrate to electrically connect a third terminal (e.g., $202_1$, FIG. 2) and a fourth terminal (e.g., $202_2$, FIG. 2) and having an electrical resistance that changes in response to exposure to the aggressive environment; a third resistive sensor (e.g., $120_1$, FIG. 1) having a first resistive element (e.g., $310_1$, FIG. 3) in electrical contact with a fifth terminal (e.g., $302_1$, FIG. 3) and a second resistive element (e.g., $310_2$, FIG. 3) in electrical contact with a sixth terminal (e.g., $302_1$, FIG. 3), the first and second resistive elements being arranged on the substrate such that insulation resistance between the first and second resistive elements changes in response to exposure to the aggressive environment; and a control circuit (e.g., 140, FIG. 1) supported on the substrate and being configured to measure electrical resistances between the first and second terminals, the third and fourth terminals, and the fifth and sixth terminals, respectively.

In some embodiments of the above apparatus, the control circuit is configured to predict whether a different circuit device on the substrate is likely to break down or be broken based on the measured electrical resistances.

In some embodiments of any of the above apparatus, the apparatus further comprises a fourth resistive sensor (e.g., $120_2$, FIG. 1) having a third resistive element (e.g., $310_1$, FIG. 3) in electrical contact with a seventh terminal (e.g., $302_1$, FIG. 3) and a fourth resistive element (e.g., $310_2$, FIG. 3) in electrical contact with an eighth terminal (e.g., $302_1$, FIG. 3), the third and fourth resistive elements being arranged on the substrate such that insulation resistance between the third and fourth resistive elements changes in response to exposure to the aggressive environment; and wherein the control circuit is further configured to measure electrical resistance between the seventh and eighth terminals.

In some embodiments of any of the above apparatus, at least one of the first and second resistive elements comprises the first metal or metallic alloy; and at least one of the third and fourth resistive elements comprises the second metal or metallic alloy.

In some embodiments of any of the above apparatus, at least one of the first and second resistive elements comprises the third metal or metallic alloy that is different from the first metal or metallic alloy and the second metal or metallic alloy.

In some embodiments of any of the above apparatus, the control circuit is configured to: process (e.g., at step 406, FIG. 4) digital values representing the electrical resistances to determine (e.g., at step 408, FIG. 4) whether or not any of a plurality of fixed conditions is satisfied; and generate (e.g., at step 410, FIG. 4) an alarm message if one or more of the plurality of fixed conditions are satisfied.

In some embodiments of any of the above apparatus, the control circuit is further configured to transmit the alarm message to an external electronic controller.

In some embodiments of any of the above apparatus, the control circuit is further configured to generate the alarm message in a manner that causes the alarm message to specify which one or more of the plurality of fixed conditions are satisfied.

In some embodiments of any of the above apparatus, the control circuit is further configured to generate the alarm message if one or more of the following fixed conditions are satisfied:
(i) at least one of the electrical resistances falls into a range bounded by one or more respective threshold resistance values (e.g., $p_{i1}<p_{i2}<p_{i3}$, for sensor $110_i$ and $\sigma_{j1}>\sigma_{j2}>\sigma_{j3}$ for sensor $120_j$, used at step 406, FIG. 4);
(ii) a rate (e.g., $v_i$ or $V_j$ determined at step 406, FIG. 4) of resistance change for any sensor is greater than a respective threshold rate (e.g., $\lambda_i$ or $\mu_j$, used at step 406, FIG. 4); and
(iii) a circuit-health indicator (e.g., H, Eq. (3)) computed using the electrical resistances is smaller than a threshold indicator value (e.g., $H_0$, used at step 406, FIG. 4).

In some embodiments of any of the above apparatus, the apparatus further comprises an integrated-circuit package (e.g., 130, FIG. 1) supported on the substrate; and wherein the control circuit is further configured to generate the alarm message using the plurality of fixed conditions that include at least one condition designed to provide an estimate of a degree of damage to the integrated-circuit package caused by exposure to the aggressive environment.

In some embodiments of any of the above apparatus, the first metal or metallic alloy comprises one or both of copper and silver; and the second metal or metallic alloy comprises one or both of copper and tin.

In some embodiments of any of the above apparatus, the electrical resistance between the first and second terminals is in the range between $0.1\Omega$ and $10\Omega$; the electrical resistance between the third and fourth terminals is in the range between $0.1\Omega$ and $10\Omega$; and the electrical resistance between the fifth and sixth terminals is greater than 10 M$\Omega$.

In some embodiments of any of the above apparatus, the electrical resistance between the first and second terminals increases in response to exposure to the aggressive environment; the electrical resistance between the third and fourth terminals increases in response to exposure to the aggressive environment; and the electrical resistance between the fifth and sixth terminals decreases in response to exposure to the aggressive environment.

According to another example embodiment disclosed above in reference to FIGS. 1-4, provided is an apparatus comprising: a substrate (e.g., part of 102, FIG. 1); a first plurality of sensors (e.g., $110_1$-$110_L$, FIG. 1) supported on the substrate, each sensor of the first plurality characterized by a respective resistance (e.g., $r_i(t)$, Eq. (1)) that tends to increase in response to the sensor being exposed to an aggressive environment; a second plurality of sensors (e.g., $120_1$-$120_M$, FIG. 1) supported on the substrate, each sensor of the second plurality characterized by a respective resistance (e.g., $R_j(t)$, Eq. (2)) that tends to decrease in response to the sensor being exposed to the aggressive environment; and a control circuit (e.g., 140, FIG. 1) supported on the substrate, electrically connected (e.g., by way of 114 and 124, FIG. 1) to each of the first plurality of sensors and each of the second plurality of sensors, and configured to determine the respective resistances of the first plurality of sensors and the second plurality of sensors.

Although embodiments of the first plurality of sensors have been described above in reference to the example conductive-track layout shown in FIG. 2, alternative conductive-track layouts are also possible. A person of ordinary skill in the art will understand, without undue experimentation, how to make and use such alternative conductive-track layouts to cause the respective resistances of the sensors of the first plurality to increase in response to the sensors being exposed to an aggressive environment. In some embodiments, different sensors of the first plurality may have different respective conductive-track layouts.

Although embodiments of the second plurality of sensors have been described above in reference to the example conductive-track layout shown in FIG. 3, alternative conductive-track layouts are also possible. A person of ordinary skill in the art will understand, without undue experimentation, how to make and use such alternative conductive-track layouts to cause the respective resistances of the sensors of the second plurality to decrease in response to the sensors being exposed to an aggressive environment. In some embodiments, different sensors of the second plurality may have different respective conductive-track layouts.

In some embodiments, solder and or protective masks may be used for defining and/or covering at least some portions of the conductive tracks and traces in the various sensors.

In some embodiments of the above apparatus, the first plurality comprises: a first sensor (e.g., $110_1$, FIG. 1) comprising an electrically conductive trace (e.g., 210, FIG. 2) that comprises a first metal or metallic alloy; and a second sensor (e.g., $110_2$, FIG. 1) comprising an electrically conductive trace (e.g., 210, FIG. 2) that comprises a different second metal or metallic alloy.

In some embodiments of any of the above apparatus, the first metal or metallic alloy comprises copper; and the second metal or metallic alloy comprises silver.

In some embodiments of any of the above apparatus, the second plurality comprises: a third sensor (e.g., $120_1$, FIG. 1) comprising an electrically conductive trace (e.g., 312, FIG. 3) that comprises the first metal or metallic alloy; and a fourth sensor (e.g., $120_2$, FIG. 1) comprising an electrically conductive trace (e.g., 312, FIG. 3) that comprises the different second metal or metallic alloy.

In some embodiments of any of the above apparatus, the second plurality comprises: a first sensor (e.g., $120_1$, FIG. 1) comprising an electrically conductive trace (e.g., 312, FIG. 3) that comprises a first metal or metallic alloy; and a second sensor (e.g., $120_2$, FIG. 1) comprises an electrically conductive trace (e.g., 312, FIG. 3) that comprises a different second metal or metallic alloy.

In some embodiments of any of the above apparatus, the first metal or metallic alloy comprises one or both of copper and silver; and the second metal or metallic alloy comprises one or both of copper and tin.

In some embodiments of any of the above apparatus, the apparatus further comprises: a first integrated-circuit package (e.g., $130_1$, FIG. 1) supported on the substrate; and a second integrated-circuit package (e.g., $130_2$, FIG. 1) supported on the substrate; wherein the first integrated-circuit package comprises copper; and wherein the second integrated-circuit package comprises silver.

In some embodiments of any of the above apparatus, the control circuit is configured to: apply a respective fixed voltage to a selected sensor of the first and second pluralities; sense a respective electrical current flowing through the selected sensor in response to the respective fixed voltage; and determine (e.g., at step 404, FIG. 4) the respective resistance of the selected sensor based on a value of the respective fixed voltage and a value of the respective electrical current.

In some embodiments of any of the above apparatus, the control circuit is configured to: drive a respective fixed current through a selected sensor of the first and second pluralities; sense a respective voltage generated across the selected sensor in response to the respective fixed current flowing therethrough; and determine (e.g., at step 404, FIG. 4) the respective resistance of the selected sensor based on a value of the respective fixed current and a value of the respective voltage.

In some embodiments of any of the above apparatus, the control circuit is configured to: process (e.g., at step 406, FIG. 4) digital values representing the respective resistances of the first plurality of sensors and the second plurality of sensors to determine (e.g., at step 408, FIG. 4) whether or not any of a plurality of fixed conditions is satisfied; and generate (e.g., at step 410, FIG. 4) an alarm message if one or more of the plurality of fixed conditions are satisfied.

In some embodiments of any of the above apparatus, the control circuit is further configured to transmit the alarm message to an external electronic controller.

In some embodiments of any of the above apparatus, the control circuit is further configured to generate the alarm message in a manner that causes the alarm message to specify which ones of the plurality of fixed conditions are satisfied.

In some embodiments of any of the above apparatus, the control circuit is further configured to generate the alarm message if one or more of the following fixed conditions are satisfied:
 (i) the respective resistance falls into a respective range bounded by one or more respective threshold resistance values (e.g., $p_{i1} < p_{i2} < p_{i3}$, for sensor $110_i$ and $\sigma_{j1} > \sigma_{j2} > \sigma_{j3}$ for sensor $120_j$, used at step 406, FIG. 4);
 (ii) a rate (e.g., $v_i$ or $V_j$ determined at step 406, FIG. 4) of resistance change for any sensor is greater than a respective threshold rate (e.g., $\lambda_i$ or $\mu_j$, used at step 406, FIG. 4); and (iii) a circuit-health indicator (e.g., H, Eq. (3)) computed using the respective resistances of the first plurality of sensors and the second plurality of sensors is smaller than a threshold indicator value (e.g., $H_0$, used at step 406, FIG. 4).

In some embodiments of any of the above apparatus, the apparatus further comprises an integrated-circuit package (e.g., 130, FIG. 1) supported on the substrate; and wherein the control circuit is further configured to generate the alarm message using the plurality of fixed conditions that include at least one condition designed to provide an estimate of a degree of damage to the integrated-circuit package caused by exposure to the aggressive environment.

In some embodiments of any of the above apparatus, the integrated-circuit package is a part of telecommunication equipment.

In some embodiments of any of the above apparatus, the respective resistances of the first plurality of sensors are in the range between 0.1Ω and 10Ω; and the respective resistances of the second plurality of sensors are greater than 10 MΩ.

In some embodiments of any of the above apparatus, a sensor of the first plurality comprises a plurality of electrically conductive traces (e.g., 210, FIG. 2) that are connected in parallel to one another between a first contact pad (e.g., $202_1$, FIG. 2) and a second contact pad (e.g., $202_2$, FIG. 2); and wherein the first contact pad and the second contact pad are electrically connected to the control circuit by way of respective conductive tracks (e.g., 114, FIG. 1) supported on the substrate.

In some embodiments of any of the above apparatus, a sensor of the second plurality comprises: a first electrically conducting comb (e.g., $310_1$, FIG. 3) electrically connected to a first contact pad (e.g., $302_1$, FIG. 3); and a second electrically conducting comb (e.g., $310_2$, FIG. 3) electrically connected to a second contact pad (e.g., $302_2$, FIG. 3); wherein the first and second electrically conducting combs are configured to have teeth of the first electrically conducting comb interleaved with teeth of the second electrically conducting comb; and wherein the first contact pad and the second contact pad are electrically connected to the control circuit by way of respective conductive tracks (e.g., 124, FIG. 1) supported on the substrate.

In some embodiments of any of the above apparatus, the apparatus further comprises a printed circuit board (e.g., 102, FIG. 1), wherein the substrate is a part of the printed circuit board.

In some embodiments of any of the above apparatus, the respective resistance of each sensor of the first plurality tends to increase in response to the sensor being exposed to the aggressive environment represented by one or more of the following conditions: (i) an ambient temperature lower than 0° C.; (ii) an ambient temperature higher than 30° C.; (iii) air humidity higher than 50%; (iv) presence of atmospheric dust; and (v) presence of a corrosive agent.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the corresponding layers are horizontal but would be horizontal where the corresponding layers are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A method comprising:
   measuring electrical properties of a plurality of electrical circuits constructed such that each of the electrical properties is responsive to damage of a corresponding one of the electrical circuits by an environmental exposure thereof; and
   via a control circuit responsive to the measured electrical properties, generating an alarm indicating damage of one or more of the electrical circuits, the alarm being in response to a prediction of whether other electrical equipment is likely to break down or be broken, the other electrical equipment being close by the plurality of electrical circuits and being susceptible to deterioration due to the environmental exposure, the prediction being based on a degree of damage sustained by the one or more electrical circuits, the degree of damage being determined by comparing the measured electrical properties with one or more thresholds.

2. The method of claim 1, wherein one or more of the electrical circuits are susceptible to internal electrical damage in response to a type of environmental exposure.

3. The method of claim 2, wherein the type of environmental exposure includes exposure to atmospheric dust.

4. The method of claim 2, wherein the type of environmental exposure includes exposure to a corrosive agent.

5. The method of claim 2, wherein the type of environmental exposure includes exposure to humidity.

6. The method of claim 2, wherein the type of environmental exposure includes exposure to a temperature below a first value or above a higher second value.

7. The method of claim 1, wherein the some of the electrical circuits are array-type circuits.

8. The method of claim 7, wherein one or more of the electrical circuits are susceptible to internal electrical damage in response to a type of environmental exposure.

9. The method of claim 8, wherein the type of environmental exposure includes exposure to atmospheric dust.

10. The method of claim 8, wherein the type of environmental exposure includes exposure to a corrosive agent.

11. The method of claim 8, wherein the type of environmental exposure includes exposure to humidity.

12. The method of claim 8, wherein the type of environmental exposure includes exposure to a temperature below a first value or above a higher second value.

13. The method of claim 1, wherein the alarm is indicative of an estimate of a working condition of the other electrical equipment.

14. The method of claim 13, wherein one or more of the electrical circuits are susceptible to internal electrical damage in response to a type of environmental exposure.

15. The method of claim 14, wherein the type of environmental exposure includes exposure to atmospheric dust.

16. The method of claim 14, wherein the type of environmental exposure includes exposure to a corrosive agent.

17. The method of claim 14, wherein the type of environmental exposure includes exposure to humidity.

18. The method of claim 14, wherein the type of environmental exposure includes exposure to a temperature below a first value or above a higher second value.

19. The method of claim 14, wherein the some of the electrical circuits are array-type circuits.

20. The method of claim 19, wherein the type of environmental exposure includes exposure to atmospheric dust.

21. The method of claim 19, wherein the type of environmental exposure includes exposure to a corrosive agent.

22. The method of claim 19, wherein the type of environmental exposure includes exposure to humidity.

23. The method of claim 19, wherein the type of environmental exposure includes exposure to a temperature below a first value or above a higher second value.

24. A method comprising:
   operating an electrical circuit that comprises:
      a first plurality of sensors supported on a substrate, each sensor of the first plurality characterized by a respective resistance that increases in response to the sensor being damaged by environmental exposure; and
      a second plurality of sensors supported on the substrate, each sensor of the second plurality characterized by a respective resistance that decreases in response to the sensor being damaged by the environmental exposure; and
   wherein the electrical circuit comprises a control circuit supported on the substrate, electrically connected to each of the first plurality of sensors and each of the second plurality of sensors, and configured to determine the respective resistances of the first plurality of sensors and the second plurality of sensors.

25. The method of claim 24,
   wherein the first plurality comprises:
      a first sensor comprising a first electrically conductive trace that comprises a first metal or metallic alloy; and
      a second sensor comprising a second electrically conductive trace that comprises a different second metal or metallic alloy; and
   wherein the second plurality comprises:
      a third sensor comprising a third electrically conductive trace that comprises the first metal or metallic alloy; and
      a fourth sensor comprising a fourth electrically conductive trace that comprises the different second metal or metallic alloy.

26. The method of claim 24, wherein the control circuit is configured to:
   process digital values representing the respective resistances to determine whether or not any of a plurality of fixed conditions is satisfied; and generate an alarm message if one or more of the plurality of fixed conditions are satisfied.

27. The method of claim 26, wherein the control circuit is further configured to transmit the alarm message to an external electronic controller.

28. The method of claim 24, wherein the control circuit is configured to predict whether the electrical circuit is likely to break down or be broken based on the determined respective resistances.

\* \* \* \* \*